June 30, 1970 J. S. LAMMING 3,518,510

PLANAR TRANSISTOR WITH SUBSTRATE-BASE CONNECTION PROVIDING AUTOMATIC GAIN CONTROL

Filed April 1, 1968 4 Sheets-Sheet 1

INVENTOR.

JACK S. LAMMING

BY Frank R. Trifari

AGENT

June 30, 1970 J. S. LAMMING 3,518,510

PLANAR TRANSISTOR WITH SUBSTRATE-BASE CONNECTION PROVIDING AUTOMATIC GAIN CONTROL

Filed April 1, 1968 4 Sheets-Sheet 2

INVENTOR.
JACK S. LAMMING
BY
[signature]
AGENT

INVENTOR.
JACK S. LAMMING
BY
AGENT

INVENTOR.
JACK S. LAMMING
BY
AGENT

United States Patent Office 3,518,510

Patented June 30, 1970

3,518,510

PLANAR TRANSISTOR WITH SUBSTRATE-BASE CONNECTION PROVIDING AUTOMATIC GAIN CONTROL

Jack Stewart Lamming, Watford, England, assignor, by mesne assignments, to U.S. Philips Corporation, New York, N.Y., a corporation of Delaware Filed Apr. 1, 1968, Ser. No. 717,796

Claims priority, application Great Britain, Mar. 31, 1967, 14,774/67

Int. Cl. H01l 11/06

U.S. Cl. 317—235 8 Claims

ABSTRACT OF THE DISCLOSURE

A A.G.C. circuit having a transistor wherein a large portion of the base region, or a region shorted to the base region, encompasses the collector region.

Figure 1:
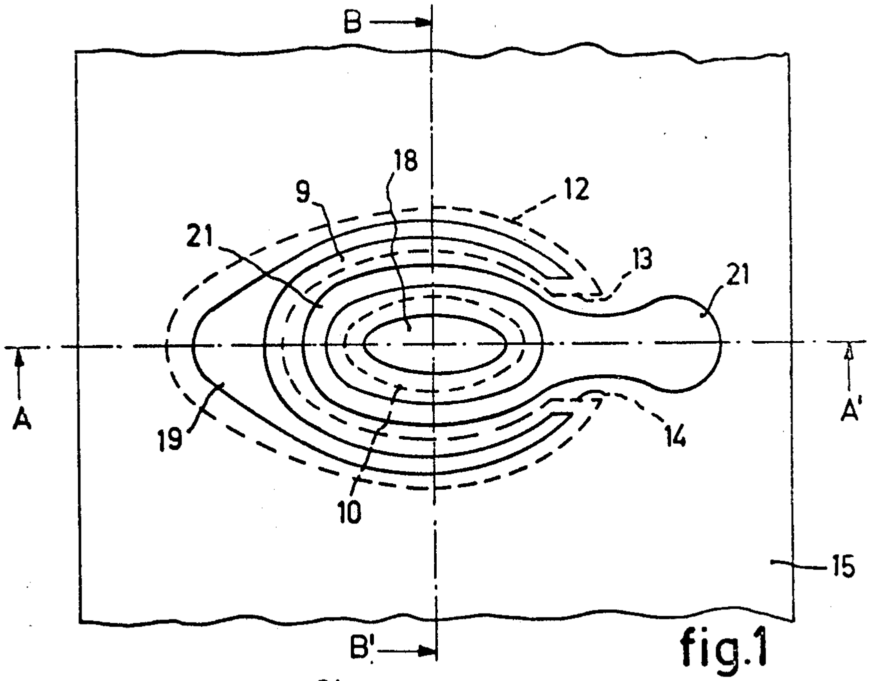

This invention relates to an automatic gain control circuit arrangement including a semiconductor device comprising a semiconductor body having a high resistivity region extending to one surface of the body in which region the emitter, base and collector regions of a transistor are situated, the emitter and collector regions being of one conductivity type and the base region being of the opposite conductivity type, the p-n junction between the emitter region and base region terminating at the one surface, the p-n junction between the base region and the collector region having a part extending to the one surface and at least partly surrounding the emitter/base junction, contacts to the emitter region, base region, and collector region, forward biasing means connected between the emitter and base contacts, reverse biasing means connected between the base and collector contacts, and also relates to a device suitable for use in the automatic gain control circuit arrangement.

There are three basic types of automatic gain control (A.G.C.) used in transistor amplifiers, namely reverse A.G.C., forward A.G.C. and voltage gain control. In reverse A.G.C., the A.G.C. signal causes the emitter current of the transistor or transistors to fall as the signal increases. This causes the emitter transition region capacitance, $C_{Te}$, to become the main limitation on $f_T$ and hence the gain falls as the signal increases. In forward A.G.C., the A.G.C. signal is used to increase the operating current, $I_c$. There are several methods of applying this forward A.G.C. In one such method if an increase in the operating current can be made to increase the collector spreading resistance, $r_{SC}$, then the product of the collector spreading resistance and the collector transition capacitance, $C_{TC}$, becomes the limiting factor controlling $f_T$ and an increase of current will cause $f_T$ to fall, thus providing gain control. In another method of forward A.G.C., reduction in gain is obtained by increasing the emitter current of a transistor which has a large collector spreading resistance, $r_{SC}$. As the emitter current is increased the voltage drop across $r_{SC}$ is sufficient to bottom the collector junction, resulting in a reduced $f_T$ which in turn gives a decrease in gain. In current gain control, forward A.G.C. is more desirable than reverse A.G.C. since in the latter method an increase in signal is accompanied by a fall of operating current. This causes more power to be dissipated at low current levels which tends to produce distortion. In one method of voltage gain control an increase in collector to base reverse bias, at constant operating current, causes an increase of $r_{SC}$ which limits $f_T$ so that the gain will fall.

It is an object of the invention, inter alia, to provide an an automatic gain control circuit arrangement including a semiconductor device and furthermore to provide a semiconductor device suitable for use, inter alia in automatic gain control circuits, particularly for use with two aforesaid the methods of forward A.G.C. and the aforesaid method of voltage gain control.

According to a first aspect of the invention, the arrangement as described in the preamble is characterized in that the semiconductor device comprises a low resistivity region of opposite conductivity type to the collector region situated adjacent the collector region and forming a p-n junction with the collector region, a contact to the low resistivity region and reverse biasing means connected between the collector contact and the contact to the low resistivity region such that in operation depletion lyaers extend into the collector region from the collector/base junction and from the p-n junction between the collector and th elow resistivity region, and the collector spreading resistance $r_{SC}$ is varied in accordance with the extent of these depletion layers to provide automatic gain control.

In one such automatic gain control circuit arrangement the included semiconductor device has external connecting leads to the emitter region, base region, collector region and low resistivity region with an external low impedance connecting path between the base region and the low resistivity region via the connecting leads thereto such that the reverse bias applied to the base/collector junction is substantially the same as the reverse bias applied to the p-n junction between the collector region and the low resistivity region.

In another such automatic gain control circuit arrangement the included semiconductor device has external connecting leads to the emitter region, base region, collector region and low resistivity region with reverse biasing means connected between the base region and the collector region and further reverse biasing means connected between the collector region and the low resistivity region so that a reverse bias is applied across the base/collector junction which is different than the reverse bias applied across the p-n junction between the collector region and the low resistivity region and hence the depletion layers associated with these junctions are varied independently of one another.

In the two last described automatic gain control circuit arrangements employing semiconductor devices having connecting leads to the emitter region, base region, collector region and low resistivity region, the semiconductor device may consist of an individually encapsulated unit having the four connecting leads extending therefrom. Alternatively the device may form part of a semiconductor integrated circuit in which an active device constituted by the high resistivity region in which the emitter, base and collector regions of the transistor are situated and the low resistivity region adjoining the collector region, has the aforesaid connecting leads which may form connections within the integrated circuit with other active components or passive components or may form external connecting leads of the integrated circuit.

In a further automatic gain control circuit arrangement the included semiconductor device has an internal low impedance connecting path situated within the semiconductor device between the base region and the low resistivity region, single reverse biasing means being connected between the collector connecting lead and the common connecting lead such that substantially the same reverse bias is applied to the collector/base junction and the p-n junction between the collector region and the low resistivity region.

According to a second aspect of the invention a semiconductor device comprises a semiconductor body having a high resistivity region extending to one surface of the body in which region the emitter, base and collector regions of a transistor are situated, the emitter and collector regions being of one conductivity type and the base region being of the opposite conductivity type, the p-n junction between the emitter region and base region terminating at the one surface, the p-n junction between the base region and collector region having a part extending to the one surface and at least partly surrounding the emitter/base junction, a low resistivity region of opposite conductivity type to the collector region situated adjacent the collector region and forming a p-n junction with the collector region, an insulating layer on the one surface, openings in the insulating layer exposing the emitter region and collector region, material in said openings forming ohmic contact with the emitter region and collector region respectively, a low resistance connecting path in the device between the base region of the transistor and the low resistivity region, and an ohmic contact situated on the body which forms a common contact to the base region and the low resistivity region.

This semiconductor device may be suitably employed in an automatic gain control circuit arrangement according to the first aspect of the invention in which the included semiconductor device has an internal low impedance connecting path between the base region and the low resistivity region situated within the semiconductor device. Within the semiconductor body the region of low resistivity material of one conductivity type adjoins the collector region of the opposite conductivity type so that on application of a reverse bias to the base-collector junction applied between the collector contact and the common contact to the base region and the low resistivity region, a depletion layer associated with the base-collector junction will exist and will extend into the collector region. Furthermore due to the low resistance connecting path between the base region and the part of the low resistivity region extending to the one surface, this reverse bias will be applied substantially across the p-n junction between the collector region and the low resistivity region and hence there will be a depletion layer associated with this junction which will extend into the collector region. With suitable dimensioning and resistivity of the collector region these two depletion layers can act to vary the collector spreading resistance $r_{SC}$. Hence voltage gain control can be achieved since on increase of the reverse bias at constant operating current, the depletion layer widths will increase and thus $r_{SC}$ will increase. Alternatively at a constant base-collector junction bias, an increase of collector current will cause the depletion layers to extend towards each other until a "pinch off" is obtained due to the self biasing action of the current flow so that forward A.G.C. may be obtained in accordance with the first above described method. As a further alternative the variation obtained in $r_{SC}$ with constant bias of the collector-base junction and due to the self biasing action of the current flow can be used as a variable load line which can be made to drive the transistor towards bottoming and the second described method of forward A.G.C. can be employed.

In one form of such a semiconductor device according to the second aspect of the invention the low resistivity region has a part extending to the one surface and the low resistance connecting path in the device is between the base region of the transistor and the part of the low resistivity region extending to the one surface.

In one particular form of such a device in which the low resistance connecting path is between the base region of the transistor and a part of the low resistivity region extending to the one surface, the path is external to the semiconductor material of the body and is situated overlaying the insulating layer on the one surface. In such a device there may be an opening in the insulating layer on the one surface exposing the base region, a metal layer in the opening forming ohmic contact with the base region and extending over the insulating layer and forming ohmic contact with a surface portion of the part of the low resistivity region extending to the one surface in a further opening in the insulating layer. The common contact to the base region and the low resistivity region may be formed by an ohmic connection to the metal layer at a position in the vicinity of its contact with the surface portion of the part of the low resistivity region extending to the one surface and remote from its contact with the base region. Alternatively the common contact to the base region and the low resitivity region may be formed by a connection to a further part of the low resistivity region extending to the one surface or to another surface of the body.

When the low resistance connecting path consists of a metal layer overlying the insulating layer on the one surface, a common contact to the base region and the low resitivity region formed by a connection to this metal layer may not have significant effect on the base series resistance. The provision of the metal layer forming the low resistance connecting path may be carried out simultaneous with the provision of the ohmic contact material in the openings in the insulating layer exposing the collector and emitter regions.

In another particular form of a device in which the low resistance connecting path is between the base region of the transistor and a part of the low resistivity region extending to the one surface, the path lies within the semiconductor material of the body and is formed by material of the one conductivity type situated adjacent the one surface between and contiguous with part of the periphery of the base region and an adjacent part of the low resistivity region extending to the one surface. The situation of the part of the low resitivity region extending to the one surface may be such that the p-n junction between the part of the low resistivity region extending to the one surface and the collector region is joined to the collector base p-n junction at locations situated at the one surface. The common contact to the base region and the low resistivity region may be formed by a metal layer situated in an opening in the insulating layer on the one surface exposing the material of the opposite conductivity type forming the low resistance connecting path. As an alternative the common contact to the base region and the low resistivity region may be formed by an ohmic contact to a further part of the low resistivity region extendig to the one surface or another surface of the body.

In a device according to the invention in which the low resistivity region has a part extending to the one surface, this part may have been formed by an isolating diffusion of a conductivity type determining impurity element characteristic of the opposite conductivity type from an opening in an insulating layer on the surface of a high resistivity epitaxial layer of the one conductivity type deposited on a substrate of the opposite conductivity type, the diffusion extending towards the substrate such that the material of the epitaxial layer situated below the opening is converted to the one conductivity type. Such a device may consist of a transistor, for example a p-n-p transistor formed in a high resistivity initially p-type epitaxial layer on a low resistivity $n^+$-type substrate with a diffused isolation $n^+$-type region extending in the epitaxial layer from the one surface to the substrate or, for example, an n-p-n transistor formed in a high resistivity initially n-type eptaxial layer on a low resistivity $p^+$-type substrate with a diffused isolation $p^+$-type region extending in the epitaxial layer from the one surface to the substrate.

The device may consist of a semiconductor integrated circuit comprising at least one transistor, the part of the low resistivity region extending to the one surface and surrounding the epitaxial region within which the transistor regions are present isolating the transistor by means of the p-n junction between the low resistivity region and the surrounded high resistivity epitaxial region from an adjacent part of the semiconductor body extending to the one surface and of the one conductivity type within which a further active component, for example, a transistor or diode, or a passive component, for example a resistor, is formed.

In another form of a device according to the invention the high resistivity region consists of material initially of the one conductivity type epitaxially deposited in a cavity in a semiconductor body or body part of low resistivity and of the opposite conductivity type. Thus the device may consist of a transistor comprising an $n^+$ or $p^+$ body having a cavity therein extending from one surface containing initially high resistivity p-type or n-type material epitaxially deposited in the cavity by the method of contour deposition and a p-n-p transistor or an n-p-n transistor respectively formed in the epitaxially deposited material.

In one preferred form of the device, the semi conductor body is of silicon, the insulating layer on the one surface is of a silicon compound, the low resistivity region is of p-type silicon and the transistor is an n-p-n silicon transistor formed in an initially n-type high resistivity epitaxial silicon region on the low resistivity p-type region by the successive diffusion of an acceptor element and a donor element through openings in the insulating layer.

In another preferred form of the device, the semiconductor body is of silicon, the insulating layer on the one surface is of a silicon compound, the low resistivity region is of n-type silicon and the transistor is a p-n-p transistor formed in an initially p-type high resistivity epitaxial silicon region on the low resistivity n-type region by successive diffusion of a donor element and an acceptor element through openings in the insulating layer.

Figure 2A:
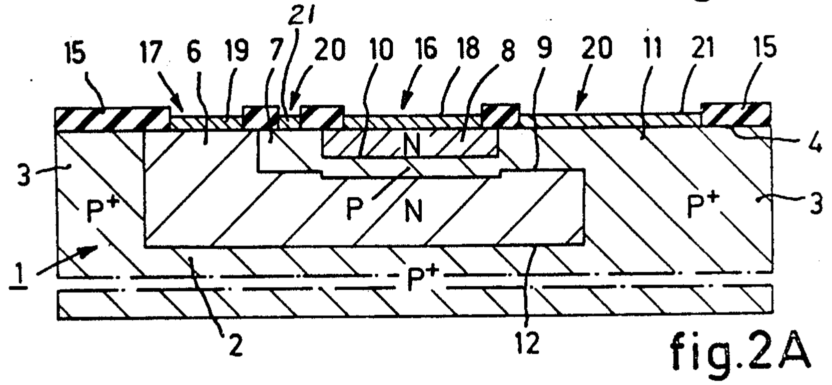
Figure 2B:
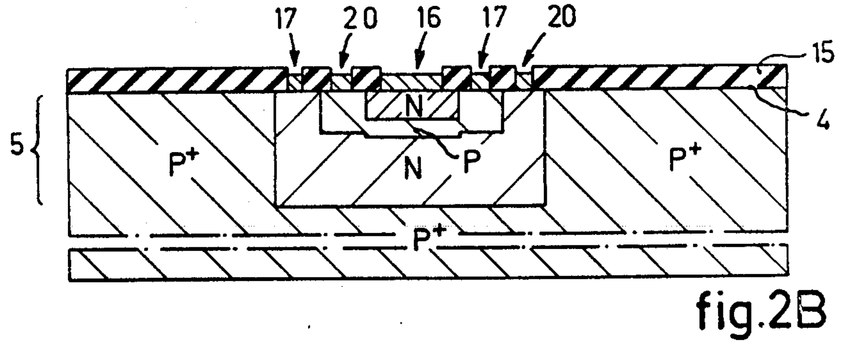

Embodiments of the invention will now be described, by way of example, with reference to the accompanying diagrammatic drawings. Initially a first embodiment of a semiconductor device according to the invention and comprising an n-p-n silicon planar transistor will be described with reference to FIGS. 1, 2A, 2B and FIGS. 3 to 6, in which FIG. 1 is a plan view of a semiconductor body having an n-p-n silicon planar transistor therein, at a stage of manufacture prior to attachment of connecting leads to various regions of the body and encapsulation in an envelope;

FIGS. 2A and 2B are vertical sections through the semiconductor body along the chain dot section lines AA′ and BB′ respectively of FIG. 1; and FIGS. 3 to 6 are vertical sections through a semiconductor body along the chain dot lines AA′ during various stages of the manufacture prior to the obtainment of the body having the structure as shown in FIGS. 1, 2A and 2B. Thereafter further embodiments of a semiconductor device according to the invention will be described with reference to FIGS. 7 to 10 which show vertical sections through the semiconductor body of four different devices. Finally two automatic gain control circuits according to the invention will be described, by way of example, with reference to FIGS. 11 and 12.

In the semiconductor device shown in FIGS, 1, 2A and 2B the semiconductor body consists of a monocrystalline silicon wafer of 0.5 mm. x 0.5 mm. x 265$\mu$ thickness, having a low resistivity, $p^+$-type region 1 which is constituted by a $p^+$ substrate part 2 and a diffused $p^+$ part 3 which extends between the substrate part 2 and a plane surface 4 of the body. The body is of 265$\mu$ thickness and initially consisted of a $p^+$ substrate of 250$\mu$ thickness having a high resistivity, n-type epitaxial layer of 15$\mu$ thickness thereon. During the deposition of the n-type epitaxial layer diffusion of the acceptor element present in the substrate occurs from the substrate into the deposited layer such that the $p^+$ substrate part is finally of 255$\mu$ thickness and the n-type part of the layer is of 10$\mu$ thickness. The diffused part 3 thus defines an internal high resistivity epitaxial region 5 of 10$\mu$ thickness in which an n-p-n transistor is formed having an n-type collector region 6, a p-type base region 7 and an n-type emitter region 8, the collector/base junction 9 and the emitter/base junction 10 terminating at the surface 4 with the junction 9 partly surrounding the junction 10. A low resistance connecting path 11 between the p-type base region 7 of the transistor and the part 3 of the $p^+$ region is situated within the semiconductor body, in p-type material, extending adjacent the surface between and contiguous with part of the periphery of the base region 7 and the adjacent surrounding part of the $p^+$ region 3 (FIG. 2A) such that the base/collector p-n junction 9 is joined to the p-n junction 12 between the collector region 6 and the $p^+$ region 1 at parts 13 and 14 on the surface 4 (FIG. 1). The p-n junctions where they extend to the surface 4 are shown in dotted outline in FIG. 1.

On the surface 4 there is an insulating layer 15 of silicon oxide which overlies the parts of the surface at which the p-n junctions extend and has openings 16 and 17 in which are situated aluminium layers 18 and 19 which form ohmic contact to the emitter region 8 and the collector region 7 respectively. In a further opening 20 extending over the surface portion of the $p^+$-type region 3, over a surface portion of the base region 7 and over part of the low resistance connecting path 11 therebetween there is an aluminium layer 21 which forms a common connection to the p-type base region 7 and to the $p^+$ region 1.

In operation of the device automatic gain control may be obtained as follows: As occurs in normal transistor operation the collector base junction 9 is reverse biased so that a depletion layer associated with this junction will extend into the collector region 6. Due to the presence of the common connection 21 and the low resistance connecting path 11, substantially the same reverse bias will be applied to the $p^+$-n junction 12 between the low resistivity $p^+$ region 1 and the n-type collector region 6 formed in the higher resistivity epitaxial material so that a depletion region associated with this junction will also extend into the collector region 6. In the "channel" part of the collector region these depletion layers will extend towards each other and thus according to the reverse bias and the signal current strength the collector spreading resistance $r_{SC}$ will be influenced, so that according to the circuit connection automatic gain control may be obtained.

The device shown in FIGS. 1, 2A and 2B is manufactured as follows:

The manufacture starts from a slice of 2.5 cm. diameter of low resistivity $p^+$ silicon of 0.005–0.015 ohm-cm. which is lapped to a thickness of 250$\mu$ and polished so it has a damage free crystal structure and an optically flat finish on at least one of its larger surfaces. The starting material being a slice of 2.5 cm. diameter will yield a plurality of individual devices by carrying out subsequent steps in the manufacture using suitable masks such that a plurality of isolated devices are formed on the single slice which are later separated by dicing but the method will now be described with reference to the formation of each isolated device, it being assumed that where masking, diffusion, etching and associated steps are referred to then these steps are simultaneously carried out for each isolated device on the single slice prior to dicing.

A layer of higher resistivity n-type silicon of 15$\mu$ thickness is epitaxially grown by deposition from the vapour phase on the prepared surface of the slice, the epitaxial layer containing the donor element phosphorus in a concentration of $2\times10^{15}$ atoms/cc. During the epitaxial deposition the acceptor element boron in the substrate diffuses from the substrate into the deposited material such that after deposition of a layer of 15$\mu$ thickness the p-n junction is located at a depth of approximately 10$\mu$ from the surface of the epitaxial layer.

A masking layer of silicon oxide of 0.5$\mu$ thickness is now grown on the surface of the epitaxial layer by treatment at 1,200° C. for 50 minutes in a silica tube in an atmosphere of wet oxygen and then for 15 minutes in an atmosphere of dry oxygen, the flow rate being 500 cc./minute and the water which the oxygen is bubbled through during the first stage being at about 90° C.

Figure 3:
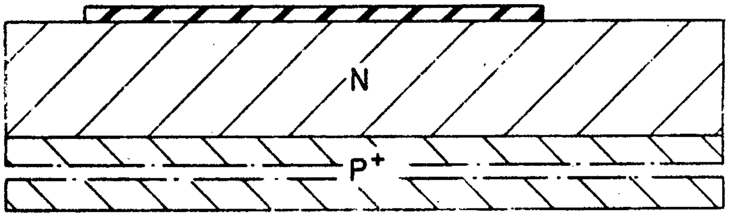

A photosensitive resist layer consisting of material available commercially as K.P.R. (Kodak Photo Resist) is applied to the surface of the silicon oxide layer. With the aid of a mask the photoresist layer is exposed such that an elliptical shaped area is exposed to the incident radiation. The unexposed part of the resist layer is removed with a developer so that a window extending from the edges of the elliptical area is formed in the resist layer. The underlying silicon oxide layer exposed by the window is now etched with a solution of hydrofluoric acid and ammonium fluoride and etching is carried out until a corresponding window is formed in the silicon oxide layer. FIG. 3 shows the semiconductor body having an elliptical shaped area of silicon oxide on the surface of an epitaxial n-type layer on a $p^+$ substrate region.

Figure 4:
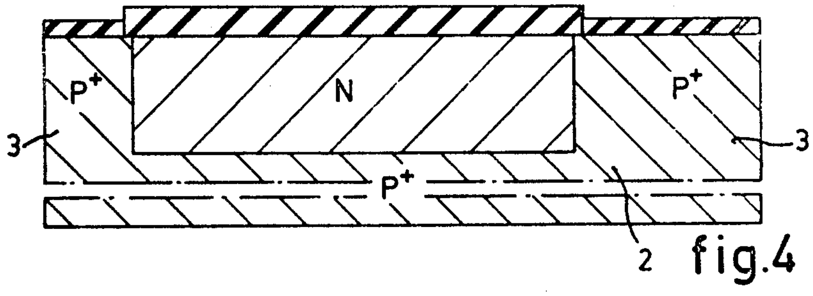

The semiconductor body is now placed in a diffusion furnace and boron is diffused into the surface of the body not protected by the silicon oxide layer. The furnace is a single zone furnace in which the boron source is of a borosilicate glass composition formed by melting together boron trioxide and silicon dioxide. The silicon body is placed in a closed quartz box which is maintained in the furnace tube for 6 hours at 1200° C. with a flow of nitrogen through the tube to maintain an inert atmosphere around the box in case the box leaks. During this diffusion step boron diffuses into the exposed surface of the silicon body and the diffusion is such that boron diffuses right through to the $p^+$ layer underlying the n-type material of the epitaxial layer. During the diffusion a layer of borosilicate glass is formed on the surface of the silicon and silicon oxide. FIG. 4 shows the semiconductor body after the diffusion with the low resistivity $p^+$-type region 3 contiguous with the $p^+$-type region 2 and surrounding a high resistivity n-type region remaining in the deposited layer. A layer of borosilicate glass extends on the surface where the window was located and also over the silicon oxide masking layer.

A further layer of silicon oxide is now grown on the surface by a similar method as used in forming the initial silicon oxide layer. A layer of photoresist, K.P.R., is then applied to the newly grown layer of silicon oxide. With the aid of a mask the photoresist layer is exposed so that an elliptical area lying above the remaining n-type material and having an extended portion overlapping part of the periphery of the diffused $p^+$ region 3 is shielded from the incident radiation. The unexposed part of the resist layer is removed with a developer so that a window is formed in the resist layer and a corresponding window is formed in the exposed silicon oxide layer by etching with hydrofluoric acid and ammonium fluoride.

Figure 5:
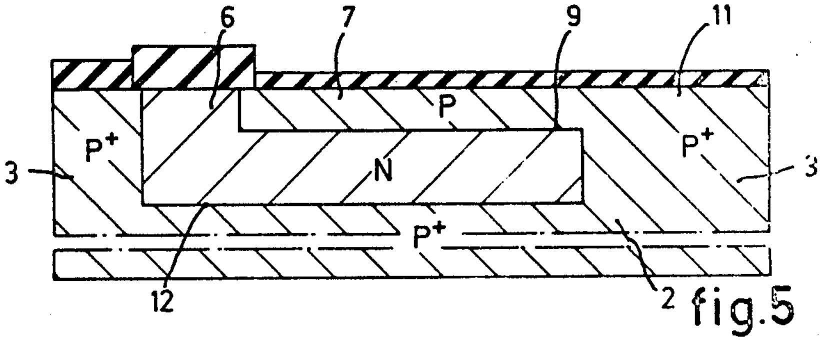
Figure 6:
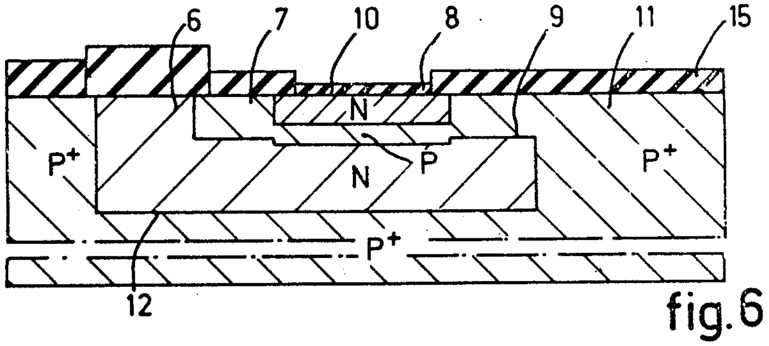

Boron is then diffused in the window in the silicon oxide layer by placing the body in a single zone diffusion furnace. The diffusion is a two stage process. In the first stage using a source of boron trioxide at 925° C. and a stream of dry nitrogen at a flow rate of 500 cc./minute, boron is diffused at a high surface concentration for 25 minutes, into the exposed surface portion in the window in the silicon oxide layer. In the second stage the boron is driven further in the body by heating the body at 1,200° C. with a stream of dry oxygen passing over the body at a flow rate of 500 cc./minute. This is carried out for 13 minutes and then the gas stream changed to wet oxygen for a further 20 minutes by bubbling the oxygen through water at about 90° C. During this diffusion treatment boron is diffused into the silicon body and a p–n junction is formed in the n-type region at a depth of 2.2$\mu$ from the surface. Due to the window having a part which exposes part of the diffused $p^+$ region, the diffused p-type region formed by the boron diffusion has a part situated adjacent the surface which is contiguous with the $p^+$ diffused region. Hence the second boron diffusion results in the formation of the p-type base region and a low resistance connecting path in p-type material between the base region and the $p^+$ type diffused region. FIG. 5 shows the body after the boron diffusion with the n-type collection region 6, the p-type base region 7 and the adjoining p-type low resistance connecting path 11. At the surface the p–n junction 12 between the diffused part 3 of the low resistivity $p^+$ region extending to the surface and the n-type collector region 6 is joined to the base/collector p–n junction 9 by parts 13 and 14 (FIG. 1) situated at the surface below the silicon oxide layer. During the second stage of the boron diffusion of silicon oxide layer is formed in the window through which the boron diffusion is effected.

A fresh photoresist layer, K.P.R., is applied to the surface and with the aid of a mask is exposed so that a central elliptical area is shielded from the incident radiation. The unexposed part of the photoresist layer and underlying silicon oxide layer is then removed by the method previously described.

An n-type emitter region is then formed by diffusion of phosphorus into the window in a two stage process. In the first stage, in a two zone furnace, the body is maintained at 1,000° C. for 50 minutes with a source of phosphorus pentoxide maintained at 210° C. Dry nitrogen is passed over the source and then over the body at a flow rate of 500 cc./minute. During this process a glass layer containing phosphorus is formed on the surface of the silicon in the window in the oxide layer and phosphorus diffuses into the underlying silicon. The glass layer in the window is removed by dissolving in a solution containing 5 parts of hydrofluoric acid and 95 parts of water for a period of about 15 seconds. In the second stage the body is maintained in the furnace at 1,000° C. with a flow of wet oxygen for 15 minutes and then a flow of dry oxygen for 10 minutes. During this process the previously diffused phosphorus is diffused further in the body and a silicon oxide layer is formed in the window from which the glass layer was removed. The diffusion results in the formation of an n-type emitter region 8 (FIG. 6) with the emitter base junction 10 at a depth of 1.5$\mu$ from the surface. Also during the diffusion the previously formed base-collector junction 9$\mu$ is pushed further into the body by a distance of 0.3$\mu$ so that the part of the base-collector junction 9 situated below the emitter-base junction 10 lies at a depth of $$2.2\mu + 0.3\mu = 2.5\mu$$

from the surface and the width of the base region therebetween is now 1.0$\mu$. This diffusion effect is generally referred to as the "base push out effect" or "emitter dip effect."

The body is removed from the furnace and a layer of photoresist, K.P.R., is then applied to the silicon oxide layer 15 on the surface. With the aid of a mask the photoresist layer is exposed so that three areas are shielded from the incident radiation, the first being an area located above and within the periphery of the n-type emitter region 8, the second being an area located above and within the periphery of the n-type collector region 6 where it extends to the surface 4 and the third being an area located above and within the periphery of the p-type base region 7, the p-type low resistance connecting path 11 and the adjoining part of the $p^+$ type diffused region 3 where they extend to the surface. The unexposed parts of the photoresist layer are removed with a developer so that three windows are formed in the photoresist layer. Thereafter etching is carried out with the previously referred to solution to form corresponding windows 16, 17 and 20 in the silicon oxide layer (FIGS. 2*a* and 2*b*). The remainder of the photoresist layer is removed by boiling in a mixture of hydrogen peroxide and sulphuric acid.

Aluminum is evaporated over the upper surface of the body so that it extends in the windows 16, 17 and 20 and on the surface of the silicon oxide layer 15. The aluminum coated surface is then covered with a photosensitive lacquer available commercially as "Kopierlac." The lacquer is exposed with the aid of a mask such that areas of the same dimensions and in registration with the previously formed windows 16, 17 and 20 are exposed to the incident radiation. Unexposed parts of the lacquer layer are then removed using a weak potassium hydroxide solution. This leaves portions of the lacquer layer above the aluminum layer at positions corresponding to the locations of the windows 16, 17 and 20 in the silicon oxide layer 15. The parts of the aluminum layer not protected by the laquer layer are then dissolved in orthophosphoric acid. The remaining lacquer is then dissolved in acetone. Aluminum layers 18, 19 and 21 remains in the windows 16, 17 and 20 respectively in the silicon oxide layer 15. The body is now placed in a furnace at 600° C. for 3 minutes in a nitrogen atmosphere to alloy the aluminum layers 18, 19 and 21 with the underlying surface parts of the body to form ohmic contacts respectively to the emitter region 8, collector region 6, and an ohmic contact which forms a common contact to the base region 7 and the $p^+$ region 3.

After alloying the silicon wafer is divided into a plurality of separate smaller wafers to yield a plurality of device sub-assemblies. The $p^+$ substrate region 2 of a wafer sub-assembly is soldered to a header part of an envelope. Wires are thermocompression bonded to the aluminium layers 18, 19 and 21 and the other extremities of the wires connected to posts on the periphery of the header. The device is then encapsulated by sealing a cap portion over the header.

Further embodiments of semiconductor devices according to the invention will now be described with reference to FIGS. 7 to 10 of the accompanying diagrammatic drawings, which each show sections through the semiconductor body of a device during a stage of manufacture prior to connection of leads to various regions of the body and subsequent encapsulation.

Figure 7:
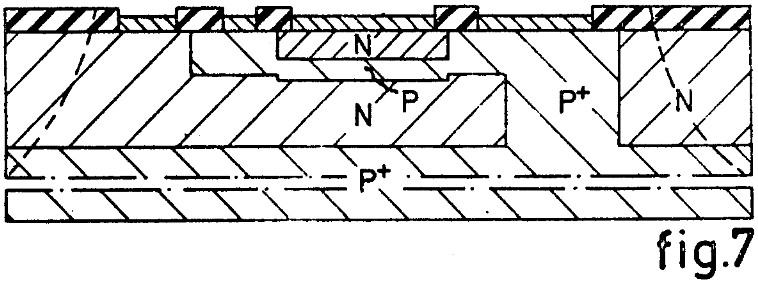

FIG. 7 shows a device similar to that shown in FIGS. 1, 2A and 2B with the exception that the $p^+$ diffused region only extends around part of the periphery of the base region, that is the $p^+$ diffusion has only been performed over a limited surface area part of the wafer. The-type base diffusion is over an area which extends to the previously diffused $p^+$ region. With such a junction configuration the area of the p-n junction between the $p^+$ region and the n-type collector region will be large which will give rise to a large capacitance of the junction. The area of the junction and hence the capacitance may be reduced by etching the body to form a mesa structure as is indicated by the dotted lines in FIG. 7.

Figure 8:
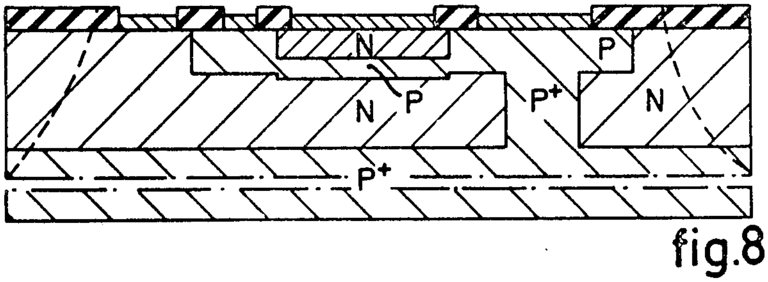

FIG. 8 shows a similar device to FIG. 7, in which the $p^+$ diffused region part extending to the surface is over a limited surface area part, but in which the p-type base diffusion has been made over an area which extends beyond the previously diffused $p^+$ region. Again the area of the p-n junction between the $p^+$ region and the n-type collector region may be limited by mesa etching as is indicated by the dotted lines in FIG. 8.

Figure 9:
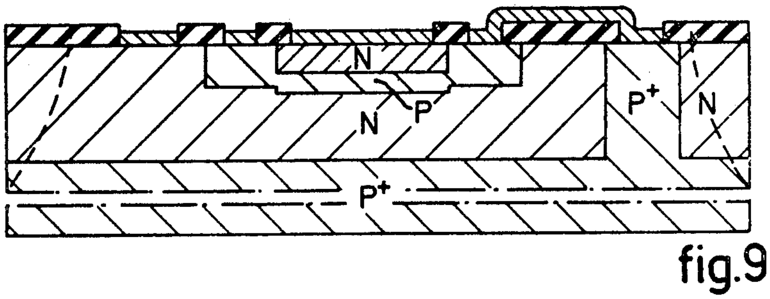

FIG. 9 shows a device in which a low resistance connecting path between a p-type base region and a part of a low resistivity $p^+$ region extending to the surface lies external to the semiconductor material of the body and is formed by a metal layer overlying a silicon oxide layer on the surface and extending between openings in the silicon oxide layer containing metal layer parts which form ohmic contacts to the p-type base region and the part of the $p^+$ region extending to the surface. A common contact to these regions is formed by bonding a wire to the part of the metal layer overlying the silicon oxide layer. In the device of FIG. 9, the part of the $p^+$ region extending to the surface is of limited surface area so that the area of the p-n junction between the $p^+$ region and the n-type collector region may be limited by mesa etching as is indicated by the dotted lines.

Figure 10:
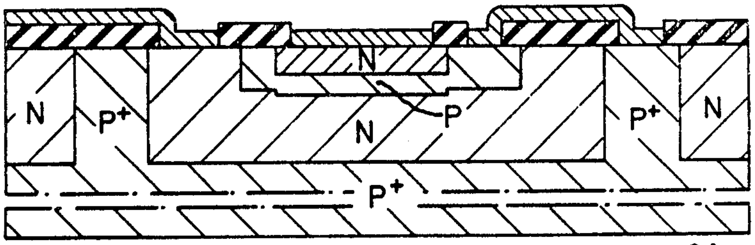

FIG. 10 shows a similar device to that shown in FIG. 9, in which the low resistance connecting path is external to the semiconductor material of the body is formed by a metal layer overlying a silicon oxide layer on the surface but in which the part of the $p^+$ region extending to the surface occupies an area such that it surrounds the n-type collector region in the body. The metal layer forming ohmic contact to the collector region also extends over the silicon oxide layer. The metal layer overlying the silicon oxide layer above the collector region and forming the low resistance connecting path between the p-type base region and the part of the $p^+$ region extending to the surface occupies part of the surface area of the body above the collector region and the metal layer forming ohmic contact to the collector region occupies another part of the surface area of the body above the collector region. A device of the structure shown in FIG. 10 may form part of a semiconductor integrated circuit in which the $p^+$ diffused regions extending between the surface and the $p^+$ substrate part serve in conjunction with the p-n junctions with the adjoining n-type material as isolation means.

The devices shown in FIGS. 7 to 10 are readily manufactured using similar methods and techniques to that described, with suitable variations where appropriate, for the manufacture of the device shown in FIGS. 1, 2A and 2B and therefore particular details will not be described herein.

Figure 11:
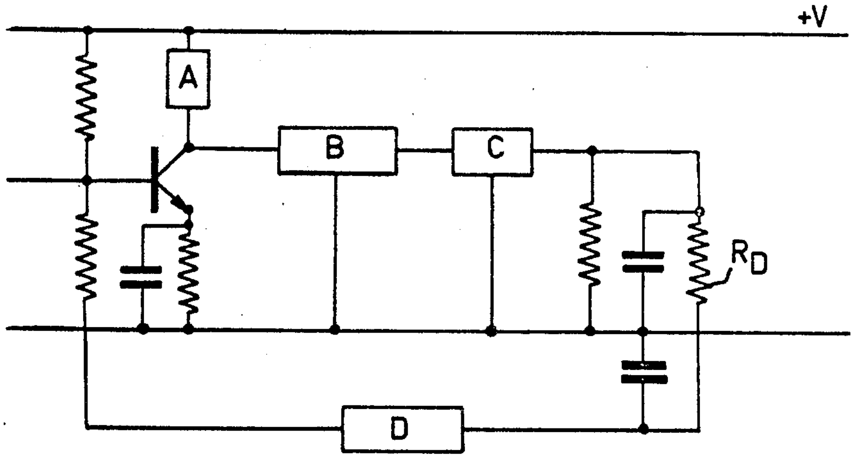

FIG. 11 shows an automatic gain control amplifier circuit including a semiconductor device as shown in FIGS. 1, 2A and 2B. The device is represented in the circuit diagram as an n-p-n transistor, the base terminal consisting of the common contact to the p-type base region of the transistor and to the $p^+$-type low resistivity region of the device. The signal input is to this base terminal. A represents a tuned circuit. A further stage B (or if desired a plurality of further stages) is connected across the output of the device between the emitter and collector terminals. The further stage is followed by a detector stage C and the return loop comprises a detector load resistance $R_D$ and an A.G.C. signal amplifier D. The D.C. signal voltage from the amplifier D is fed back to the input of the device at the base terminal. Forward A.G.C. is obtained in this circuit since on increase of the A.C. signal amplitude at the input the D.C. signal from the amplifier D acts to increase the collector current through the transistor of the device which causes the depletion layers associated with the base/collector junction and with the p-n junction between the collector region and the $p^+$-type low resistivity region to extend towards each other in the collector region due to the self-biasing action of the current flow. Thus $r_{SC}$ increases and the gain of the transistor falls.

Figure 12:
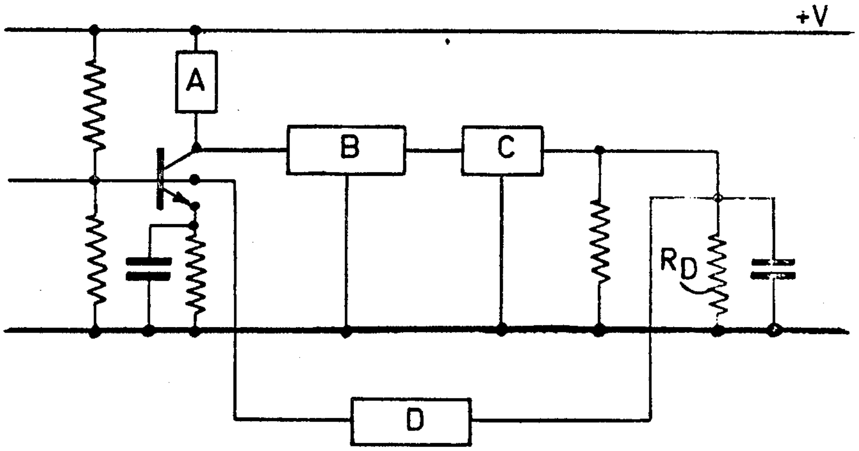

FIG. 12 shows an automatic gain control amplifier circuit including a semiconductor device having four external connecting leads. The device has three regions of alternating conductivity type forming an n-p-n transistor and a fourth, low resistivity $p^+$-type region adjacent and forming a p-n junction with the the n-type collector region of the transistor. The device is represented as an n-p-n transistor having a fourth terminal which is the lead connected to the low resistivity $p^+$-type region. The circuit is similar to the circuit of FIG. 11 but the signal from the A.G.C. signal amplifier D is now applied to the fourth terminal. A D.C. bias supply may be included in the A.G.C. loop to produce a delay in the A.G.C. signal. In this circuit voltage gain control is obtained at a constant collector current through the transistor. On increase in the A.C. signal amplitude at the input the D.C. signal from the A.G.C. signal amplifier D acts to increase the reverse bias applied to the p-n junction between the collector region and the $p^+$-type region. This results in the depletion layer associated with this junction increasing and spreading further into the collector region towards the depletion layer associated with the base/collector junction until pinch-off in the collector region occurs. Due to the increase of the depletion layer between the collector and p+-type region $r_{SC}$ increases and the gain of the transistor falls.

What is claimed is:

1. A transistor circuit arrangement comprising a semiconductor body having a high resistivity portion containing a collector region extending to one surface of the body, emitter and base regions situated in said high resistivity portion, the base region having a lower resistivity than the collector region, the emitter and collector regions being of one conductivity type and the base region of the opposite conductivity type forming an emitter-base p-n junction extending to said one surface and a base-collector p-n junction having a part extending to said one surface and at least partly surrounding the emitter-base junction, a region of said body having low resistivity relative to that of the collector region and of the opposite conductivity type and adjacent the collector region and forming a low resistivity region-collector p-n junction, an insulating layer on said one surface and having openings over the emitter, base and collector regions, ohmic contacts through the emitter, base and collector openings to the emitter, base and collector regions, an ohmic contact to the low-resistivity region, forward biasing means connected between the emitter and base contacts and including means for introducing an input electrical signal to the emitter or base contacts, an impedance coupled to the collector contact, reverse biasing means connected between the base and collector regions and between the low-resistivity region and the collector region, means for deriving an output signal from the collector and across the impedance, and means for coupling a part of the output signal back to the base contact or the low-resistivity region, whereby in operation depletion layers extend into the collector from both the base-collector junction and the low resistivity region-collector junction varying the collector spreading resistance in accordance with the extent of these depletion layers to provide automatic gain control.

2. The arrangement of claim 1 wherein the same reverse bias means is connected between the collector and the base regions and between the collector and the low-resistivity region.

3. A transistor circuit arrangement comprising a semiconductor body having a high resistivity portion containing a collector region extending to one surface of the body, emitter and base regions situated in said high resistivity portion, the base region having a lower resistivity than that of the collector, the emitter and collector regions being of one conductivity type and the base region of the opposite conductivity type forming an emitter-base p-n junction extending to said one surface and a base-collector p-n junction having a part extending to said one surface and at least partly surrounding the emitter-base junction, a substrate region of said body situated below and adjacent said collector region and having low resistivity relative to that of the collector region and of the opposite conductivity type, a low resistivity region of said opposite conductivity type in the body extending from the substrate region to the said one surface and also adjacent the collector region and forming together with the substrate a substrate-collector p-n junction, an insulating layer on said one surface and having openings over the emitter, base and collector regions, ohmic contacts through the emitter and collector openings to the emitter and collector regions, means associated with the body forming a common ohmic connection to the base and to the substrate region via the low resistivity region, an input circuit connected to the emitter or base contacts, an output circuit connected to the collector contact, and means for coupling a part of the signal appearing in the output circuit back to the common ohmic connection to provide automatic gain control.

4. A transistor arrangement as set forth in claim 3 wherein the body also includes a low-resistance connecting path between the base region and the substrate region.

5. A transistor arrangement as set forth in claim 4 wherein the transistor is part of a monolithic integrated circuit and is isolated from the remainder of the circuit by diffused walls of said opposite conductivity type, said low-resistance connecting path connecting the base region to a diffused wall.

6. A transistor arrangement as set forth in claim 3 wherein a first ohmic contact is made to the base region through an opening in the insulating layer, and a second ohmic contact connected to the first ohmic contact is made to the low resistivity region extending to the said one surface through an opening in the insulating layer.

7. A transistor arrangement as set forth in claim 3 and including an ohmic contact on the surface and partly overlaying the insulating layer and extending between and to the base region and the low-resistance region.

8. A transistor circuit arrangement comprising a semiconductor body having a high resistivity portion containing a collector region extending to one surface of the body, emitter and base regions situated in said high resistivity portion, the base region having a lower resistivity than the collector region, the emitter and collector regions being of one conductivity type and the base region of the opposite conductivity type forming an emitter-base p-n junction extending to said one surface and a base-collector p-n junction having a part extending to said one surface and at least partly surrounding the emitter-base junction, a region of said body having low resistivity relative to that of the collector region and of the opposite conductivity type and adjacent the collector region and forming a low resistivity region-collector p-n junction, an insulating layer on said one surface and having openings over the emitter, base and collector regions, ohmic contacts through the emitter, base and collector openings to the emitter, base and collector regions, an ohmic contact to the low-resistivity region, forward biasing means connected between the emitter and base contacts, reverse biasing means connected between the base and collector regions and between the low-resistivity region and the collector region such that in operation depletion layers extend into the collector from both the base-collector junction and the low resistivity region-collector junction and the low resistivity region-collector junction varying the collector spreading resistance in accordance with the extent of these depletion layers to provide automatic gain control, and means coupled between the collector and the low resistivity region and responsive to an increase in signal level to increase the extent of the depletion layers and increase the collector spreading resistance and thus reduce the gain of the circuit.

References Cited

UNITED STATES PATENTS

| | | | |
|---|---|---|---|
| 3,309,537 | 3/1967 | Archer | 317—235 |
| 3,319,174 | 5/1967 | Hellstrom | 317—235 |
| 3,372,070 | 3/1968 | Zuk | 317—235 |
| 3,418,545 | 12/1968 | Hutson | 317—235 |

JERRY D. CRAIG, Primary Examiner

U.S. Cl. X.R.

307—299; 330—36

UNITED STATES PATENT OFFICE
CERTIFICATE OF CORRECTION

Patent No. 3,518,510 Dated June 30, 1970

Inventor(s) JACK STEWART LAMMING

It is certified that error appears in the above-identified patent and that said Letters Patent are hereby corrected as shown below:

Column 1, line 71, omit "an".

Column 2, line 14, "lyaers" should read -- layers --.

line 16, "th elow" should read -- the low --.

line 63, after "region," insert -- connecting leads to the emitter region and collector region, and a common connecting lead to the base region and the low resistivity region, --.

Column 4, line 64, "eptaxial" should read -- epitaxial --.

Column 8, line 13, "of" (second occurence) should read -- a --.
line 34, omit "of" (first occurence).
line 43, "the" (second occurence) should read -- this --.
line 44, omit "$\mu$".

Column 9, line 44, "The-type" should read -- The p-type --.

Column 10, line 5, after "body" insert -- and --.

Signed and sealed this 17th day of November, 1970.

(SEAL)
Attest:

Edward M. Fletcher, Jr.
Attesting Officer

WILLIAM E. SCHUYLER, JR.
Commissioner of Patents